(12) United States Patent
Hutter et al.

(10) Patent No.: US 6,352,887 B1
(45) Date of Patent: Mar. 5, 2002

(54) MERGED BIPOLAR AND CMOS CIRCUIT AND METHOD

(75) Inventors: Louis N. Hutter, Richardson; Peter Ying; Marco Corsi, both of Plano; Imran Khan, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/276,780

(22) Filed: Mar. 25, 1999

Related U.S. Application Data

(60) Provisional application No. 60/079,444, filed on Mar. 26, 1998.

(51) Int. Cl.[7] ................. H01L 21/8238; H01L 21/8249; H01L 21/8228; H01L 21/331
(52) U.S. Cl. .................... 438/202; 438/203; 438/236; 438/327; 438/374
(58) Field of Search .................. 438/203, 202, 438/234, 236, 204, 325, 327, 335, 316, 200, 153, 366, 374; 257/370, 565

(56) References Cited

U.S. PATENT DOCUMENTS

| | | | | |
|---|---|---|---|---|
| 4,994,887 A | * | 2/1991 | Hutter et al. | 257/370 |
| 5,171,702 A | * | 12/1992 | Prengle | 437/59 |
| 5,342,794 A | * | 8/1994 | Wei | 438/374 |
| 5,403,758 A | * | 4/1995 | Yoshihara | 438/366 |
| 5,407,840 A | * | 4/1995 | Manoliu et al. | 438/202 |
| 5,407,841 A | * | 4/1995 | Liao et al. | 437/31 |
| 5,422,290 A | * | 6/1995 | Gruisch | 438/234 |
| 5,811,871 A | * | 9/1998 | Nakashima | 257/565 |
| 5,814,538 A | * | 9/1998 | Kim et al. | 438/153 |
| 5,953,600 A | * | 9/1999 | Gris | 438/200 |
| 6,117,716 A | * | 9/2000 | Manning | 438/202 |
| 6,127,236 A | * | 10/2000 | Prall et al. | 438/316 |
| 6,180,442 B1 | * | 1/2001 | Gris | 438/202 |
| 6,245,604 B1 | * | 6/2001 | Violette et al. | 438/202 |
| 6,281,060 B1 | * | 8/2001 | Igarashi et al. | 438/202 |

FOREIGN PATENT DOCUMENTS

| | | | | |
|---|---|---|---|---|
| GB | 2081508 A | * | 7/1981 | 21/90 |
| JP | 05267331 A | * | 10/1993 | 21/336 |

OTHER PUBLICATIONS

A. R. Alvarez, ed., 3.1 Evolution of BiCMOS From a CMOS Perspective, Kluwer Acad. Publ. 1989, pp. 65–68.
J. A. Bruchez, et al., The Philosophy of a Simple Collector Diffusion Isolation Bipolar Process, Solid State Technology/Aug. 1987, pp. 93–97.
Robert T. Havemann, et al., Process Integration Issues for Submicron BiCMOS Technology, Solid State Technology/Jun. 1992, pp. 71–76.

* cited by examiner

*Primary Examiner*—Matthew Smith
*Assistant Examiner*—Chuong Anh Luu
(74) *Attorney, Agent, or Firm*—Jacqueline J. Garner; W. James Brady, III; Frederick J. Telecky, Jr.

(57) ABSTRACT

A method for fabricating a BiCMOS integrated circuit. The method includes the steps of forming in a single implantation step a base region 211 of a bipolar transistor and a p-well 212 of an n-channel MOS transistor; and forming in a single implantation step a collector contact well 213 of a bipolar transistor and an n-well 208 of a p-channel MOS transistor.

5 Claims, 13 Drawing Sheets

MERGED BIPOLAR AND CMOS CIRCUIT AND METHOD

This application claims priority under 35 USC § 119 (e)(1) of provisional application Ser. No. 60/079,444, filed Mar. 26, 1998.

FIELD OF THE INVENTION

This invention relates to semiconductor integrated circuits, and more specifically to integrated circuits that merge bipolar and CMOS technologies.

BACKGROUND OF THE INVENTION

Modern integrated circuits are typically based on either complementary-symmetry metal-oxide-semiconductor (CMOS) transistors or bipolar transistors. CMOS offers the advantages of a relatively inexpensive process, low power dissipation, and transistors that can be tightly packed and scaled. These features make CMOS a popular choice for very large scale digital integrated circuits such as those used in memory and microprocessor applications. Bipolar, on the other hand, is a preferred choice for analog applications because of its ability to provide high speed, high drive current, and good noise margin. Additionally, bipolar transistor junctions provide smaller threshold voltage variations and are therefore often used as voltage references.

So-called "BiCMOS" fabrication processes seek to offer the benefits of both transistor topologies on a single integrated circuit. BiCMOS processes in the past that have attempted to optimize both types of transistors have suffered from high complexity and hence a much higher cost than a standard high-performance CMOS process. Recent trends in the semiconductor industry toward low-voltage circuits with high signal-to-noise ratios have brought a renewed focus to BiCMOS circuits.

Figure 1A:
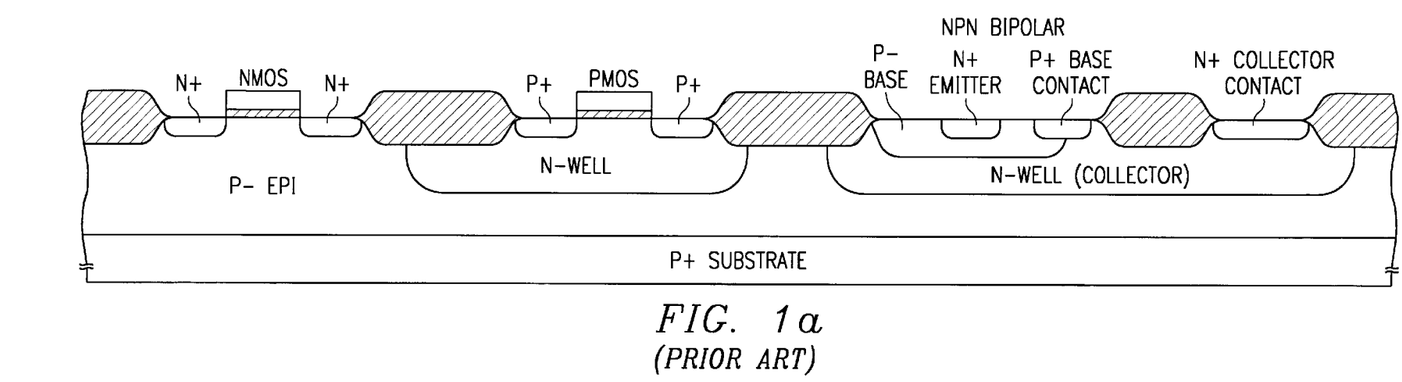
FIGS. 1a, 1b, and 1c are cross-sectional diagrams of prior art BiCMOS structures.
Figure 1B:
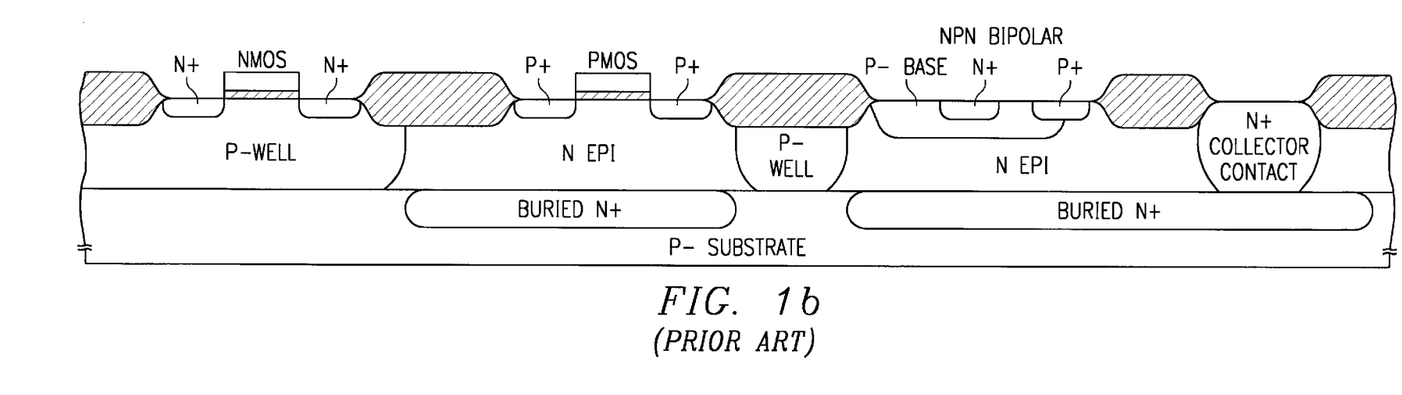
Figure 1C:
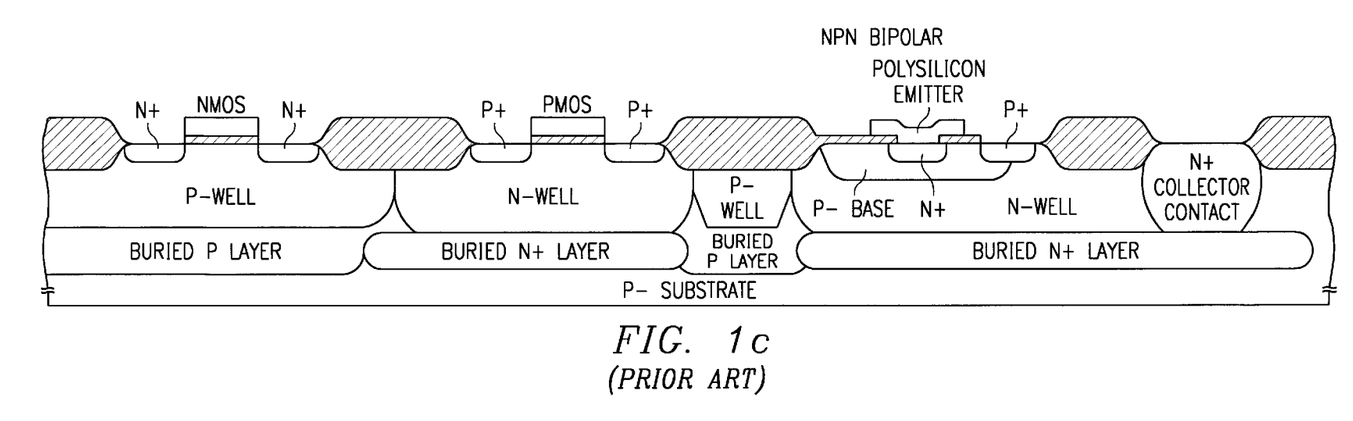

Performance has traditionally been commensurate with process complexity in BiCMOS circuits. Additional mask levels and dopant implant steps provided better isolation, latch-up protection, and superior bipolar performance. FIGS. 1a, 1b, and 1c are examples of three prior art BiCMOS configurations described in "BiCMOS Technology and Applications", A. R. Alvarez, ed., Kluwer Academic Publ., 1989, pp. 65–68. These figures illustrate the typical performance/complexity tradeoff. The structure shown in FIG. 1a is a so-called "n-well" CMOS process that incorporates a simple npn bipolar transistor. The channels of MOSFET transistors in a typical CMOS circuit are often formed in doped regions known in the art as "wells". In FIG. 1a, the p-channel MOSFET is formed in an n-well, whereas the n-channel MOSFET is formed in the p– epitaxial layer. "Twin-well" CMOS incorporates a p-well for the n-channel device to allow further optimization of the n-channel transistor's performance characteristics. Additional wells also simplify device isolation.

In order to lessen the parasitic collector resistance and collector-base capacitance, more complex processes add a buried subcollector (n+) layer and substitute n-type epitaxial layers for the p– epi of FIG. 1a. The buried layers help prevent latch-up, thereby allowing the use of a p– substrate rather than the p+substrate in FIG. 1a. The bipolar transistor of FIG. 1b has superior performance characteristics over the structure of FIG. 1a at the cost of the additional mask levels and implants for the buried layer and the deep n+ collector contact. The structure shown in FIG. 1c is a high-performance twin-well BiCMOS circuit requiring even more complex processing.

A need exists in the industry for a process for building efficient high-gain bipolar transistors in a high-performance advanced CMOS process to produce increased analog circuit performance and flexibility at a cost comparable to that of the CMOS process alone.

SUMMARY OF THE INVENTION

In accordance with a preferred embodiment of the invention, there is disclosed a method for fabricating a BiCMOS integrated circuit. The method includes the steps of forming in a single implantation step a base region of a bipolar transistor and a p– well of an n-channel MOS transistor; and forming in a single implantation step a collector contact well of a bipolar transistor and an n-well of a p-channel MOS transistor.

In accordance with another preferred embodiment of the invention, there is disclosed a bipolar transistor. The transistor includes a collector region of a first doping profile within a semiconductor substrate of lighter doping and a base region between the collector region and a surface of the semiconductor substrate. The base region adjoins the collector region and extends to the surface. An emitter region adjoins the base region and also extends to the surface. A collector contact well region adjoins the collector region and the base region, and extends to the substrate surface as well. The well region has a doping profile characterized by doping concentrations lighter than doping concentrations of the first doping profile.

An advantage of the inventive concepts is that a bipolar transistor can be fabricated using a twin-well CMOS process.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

A first preferred embodiment structure and process in accordance with the invention are described below with reference to FIGS. 2a to 2l.

(a) Begin with a p-type substrate 200 doped to a concentration sufficient to produce a resistivity in the range of approximately 6 to 8 ohm-cm. The substrate can be a p– surface region of a silicon wafer or a p– silicon epitaxial layer over a p+ surface region of a wafer, for example. In the latter case, the epitaxial layer thickness is preferably in the range of 10 to 20 um.

(b) Grow an oxide layer (not shown) approximately 500 nm thick over the substrate and, using conventional photoresist processes, pattern the photoresist (not shown) for the formation of the buried layer 202. Implant antimony at a dose of 2.0E15 at 60 keV, for example, followed by a 30 second drive at 1250° C. Strip the oxide. This may be followed by an optional blanket boron implant at a dose of 6.0E12 at 50 keV, for example, to improve the isolation between other nearby buried layer regions (not shown). Note that an optional blanket p-doped buried layer (not shown) can also be implanted.

(c) Deposit p– epitaxial layer 204 using conventional processes. Layer 204 has a resistivity of approximately 6 to 8 ohm-cm and a thickness of approximately 3 um, for example. Diffusion of the buried layer dopants into the p– epitaxial layer 204 results in the buried layer 202 being partially in the substrate 200 and partially in the epi layer 204. The doping profile of the buried layer 202 is characteristic of a heavy n-type impurity implant followed by a diffusion cycle and epi overgrowth. See FIG. 2a.

(d) Thermally grow a pad silicon oxide 206 approximately 20 nm in thickness.
Using low pressure chemical vapor deposition (LPCVD), for example, deposit an approximately 140 nm silicon nitride layer (not shown) over the pad oxide. Deposit and pattern photoresist (not shown) over the nitride layer to form the doped regions 208 referred to hereinafter as the n-wells. After the patterning of the photoresist, remove the exposed portions of the nitride layer. Implant phosphorous at a dose of 1.0E13 at 150 keV, then grow an approximately 400 nm thick n-well oxide 210. Remove the nitride layer (not shown) using hot phosphoric acid, for example. Implant boron at a dose of 6.0E12 at 50 keV using n-well oxide 210 as a self-aligning mask to form the doped regions 212 referred to hereinafter as the p-wells. Perform a high temperature drive at about 1100° C. for approximately 500 minutes to diffuse the well dopants into the epi layer 204. The diffusion temperature and time produce a dopant profile in which the n-well 208 and the buried layer 202 adjoin together where the n-well is formed over the buried layer. The dopant profiles of the p-wells 212 are similar to one another because they are produced in the same implant and diffusion operations. The same is true of the n-wells 208. Note that the doping of the n-wells 208 is lighter than that of the buried layer 202. See FIG. 2b.

(e) Strip the pad oxide 206 and n-well oxide 210. Grow a new pad oxide 214.
Follow this with a new LPCVD nitride layer 216. Deposit photoresist (not shown) and pattern in preparation for forming the moat regions. Remove the portions of nitride layer 216 left exposed by the photoresist. See FIG. 2c.

(f) Grow field oxide regions 218 to a thickness of approximately 620 nm using atmospheric or high-pressure standard local oxidation of silicon (LOCOS) techniques, for example. See FIG. 2d.

(g) Remove the nitride layer 216 and pad oxide 214. Grow dummy gate oxide 220. Deposit photoresist 222 and pattern in preparation for a threshold adjustment implant for the n-channel MOS transistor and the base 211 of the NPN bipolar transistor. Perform threshold adjust, punch-through block, and channel stop implants using boron at the following approximate doses and energies: 1.5E12 at 20keV, 4.0E12 at 70 keV, and 2.0E12 at 180 keV, respectively. These implants serve to set the channel and field threshold voltages for the n-channel MOS transistor. The stop implant also augments the doping of the p-well 212, which acts as the base 211 of the npn bipolar transistor. See FIG. 2e. Note that the n-channel threshold adjust, punch-through block, and channel stop implants are referred to collectively hereinafter as the "VTN" implants.

(h) Remove photoresist 222. Deposit photoresist 224 and pattern in preparation for the threshold adjustment, punch-through, and channel stop implants (hereinafter the "VTP" implants) for the p-channel MOS transistor. Perform threshold adjust, punch-through block, and channel stop implants using phosphorus at the following approximate doses and energies: 1.5E12 at 50 keV, 5.0E12 at 150keV, and 2.5E12 at 380 keV, respectively. These implants serve to set the channel and field threshold voltages for the p-channel MOS transistor. See FIG. 2f.

(i) Remove dummy gate oxide 220. Form gate oxide 226 by thermal oxidation, for example, to a thickness in the range of approximately 7 to 15 nm. Blanket deposit undoped polycrystalline silicon to a thickness of approximately 310 nm. Deposit photoresist (not shown) and pattern to expose the n-channel MOS gate region. Perform a phosphorus implant at a dose of approximately 3.0E15 at 50 keV. Anneal the structure at about 900° C. for approximately 30 minutes. Remove the existing photoresist and deposit another layer of photoresist (not shown) and pattern and etch to form n-doped poly gate 228 for the n-channel MOS transistor and the undoped poly gate 230 for the p-channel MOS transistor. See FIG. 2g. Poly resistors, capacitor electrodes, and other passive components are also formed in this poly etching step. Note that the undoped poly gate 230, which is covered by photoresist for the phosphorus implant above, can optionally be n-doped as is poly gate 228. An undoped p-channel MOS gate results in a surface-channel transistor, whereas an n+ poly gate results in a buried-channel transistor.

(j) Deposit photoresist 231 and pattern to expose the n-channel MOS transistor and the emitter and collector contact well 213 regions of the npn bipolar transistor. Perform a low-doped drain (LDD) implant in the n-channel MOS transistor source/drain moat regions 232, the NPN collector contact moat 234, and the npn emitter 236. The LDD implant is performed using phosphorus at a dose of 6.0E13 at 50 keV, for example. Form 200 nm sidewall spacers 237 of oxide or nitride on the polysilicon gates 228 and 230 using standard techniques. Perform an arsenic implant at a dose of approximately 3.0E15 at 120 keV followed by a phosphorus implant at a dose of 4.0E14 at 50 keV to finalize the source/drain regions 232, the npn collector contact 234, and the npn emitter 236. See FIG. 2i.

(k) Remove the existing photoresist 231 and deposit and pattern photoresist 238 to expose the p-channel MOS transistor and the base region 211 of the npn bipolar transistor. Perform boron implant at a dose of 3.0E15 at 20 keV to form the source/drain moat regions 240 of the p-channel MOS transistor and the base contact 242 of the npn bipolar transistor. Anneal at about 875° C. for approximately 35minutes. See FIG. 2j. Note that the boron implant also dopes the previously undoped poly gate 230 of the p-channel MOS transistor.

(l) Deposit a layer of oxide 244 approximately 100 nm in thickness to serve as a silicidation mask. Deposit photoresist 246 and pattern to cover portions of the gate oxide layer 226 and silicidation mask oxide 244 stack at the edges of the emitter region 236 and over the field oxide regions 218 adjacent the emitter region. Remove the exposed gate oxide layer 226. See FIG. 2k.

(m) Deposit titanium to a thickness of about 60 nm and heat at about 675° C. for approximately 30 minutes to form self-aligned silicide 250 over the p-channel MOS source/drain moat regions 240, the n-channel MOS source/drain moat regions 232, the collector contact 234, the base region 242, the emitter region 236, and the poly gates 228 and 230. The absence of silicide at the periphery of the emitter reduces the chance of degraded gain ($h_{fe}$) from recombination effects at the emitter edge that result from uneven silicide thickness or spiking at the bird's beak region. Note that an alternative method is to simply silicide the entire emitter region 236.

(n) Deposit an oxide layer 252 of approximately 1 um thickness and planarize using resist etch-back techniques, for example. Deposit photoresist (not shown) and pattern to form contact vias to the source/drain contacts of the MOS transistors and to the base, emitter, and collector contacts of the npn bipolar transistor. Etch the oxide layer 252 to expose the underlying contact regions. Remove the photoresist and fill the vias with TiW 254 followed by AlCu 256, for example. Alternative metal schemes include tungsten plugs followed by TiN/AlCu or entirely tungsten metal. Deposit photoresist and pattern to form desired interconnections in the metal layer. Remove the photoresist. See FIG. 2l. Apply subsequent interlevel dielectric and metal layers using conventional techniques.

Figure 3:
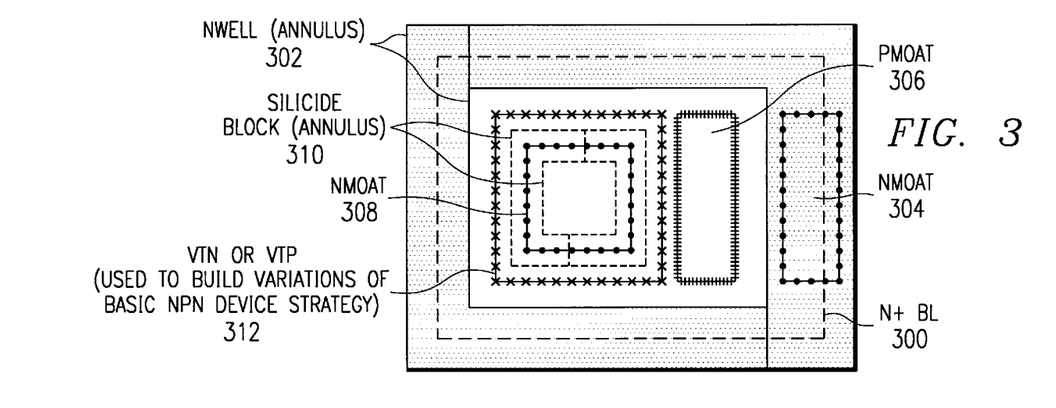
FIG. 3 is a plan view of the first embodiment structure of FIG. 2l, exclusive of the metal layer 256.

FIG. 3 is a top or plan view of the npn bipolar transistor layout described above. The structure is shown exclusive of the metal layers 254 and 256 and is included here to show the spatial relationship of the various mask levels used in the embodiment processes. The outer bounds of the buried layer are indicated by the dashed line 300 in FIG. 3 and corresponds to element 202 in the series of cross-sections of FIGS. 2a to 2l. The n-well 208 in FIG. 2 is shown as the annulus 302 in FIG. 3. The outer bounds of the collector contact n-moat 234 is shown as element 304 in FIG. 3. The outer bounds of the base contact p-moat 242 is shown as element 306 in FIG. 3. The outer bounds of the emitter contact n-moat 236 is shown in FIG. 3 as element 308. The silicidation mask oxide 244 of FIG. 2 is shown as the annulus 310 in FIG. 3. Finally, the outer bounds of the mask that may be used for threshold adjustment implants in the emitter region, described hereinbelow in additional embodiments, is shown as element 312 in FIG. 3.

Figure 2A:
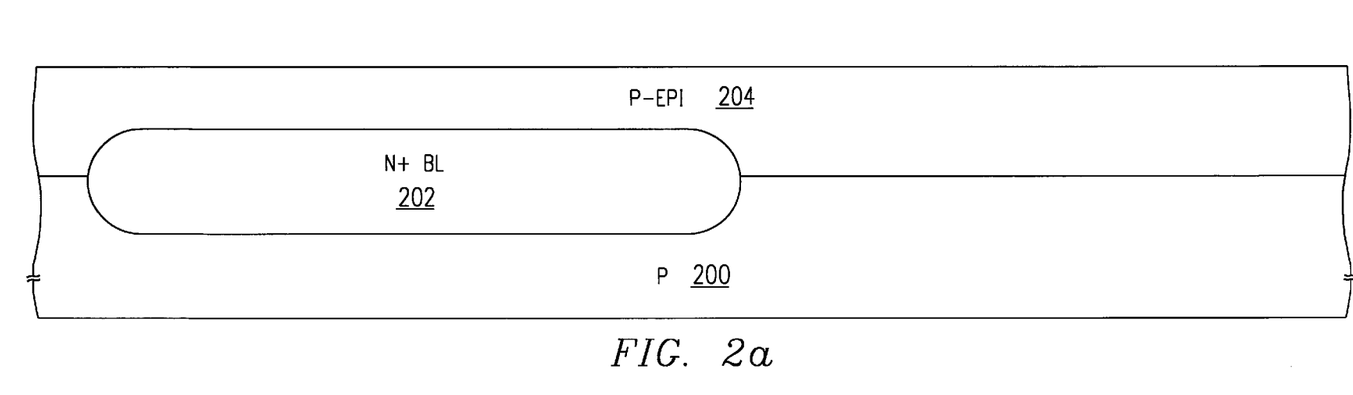
FIGS. 2a to 2l are cross-sectional diagrams of a first embodiment BiCMOS structure at various steps in a first embodiment process.
Figure 2B:
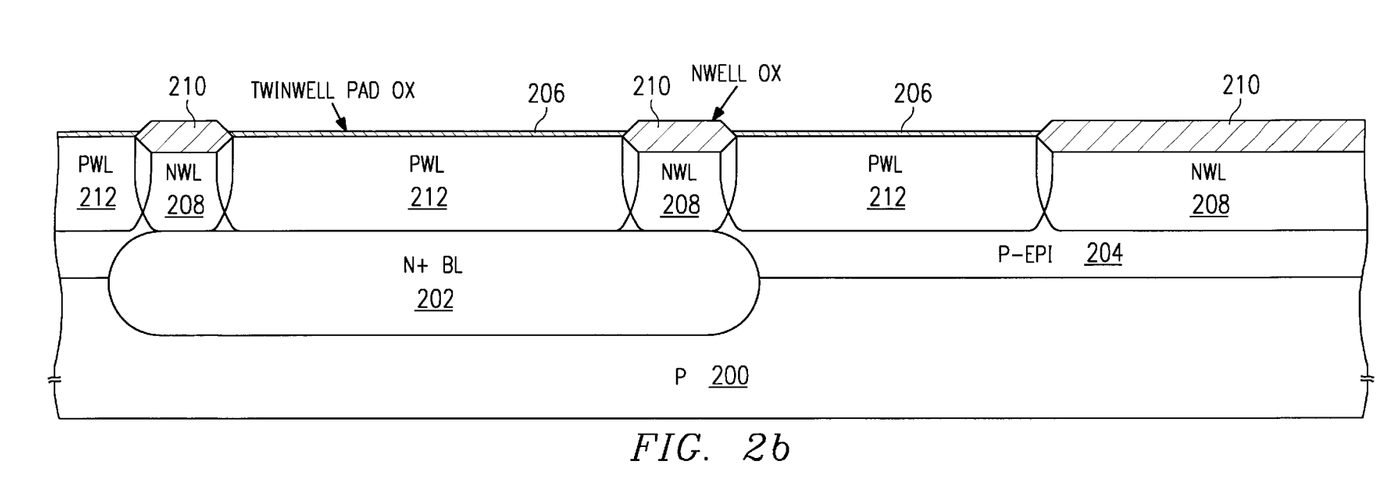
Figure 2C:
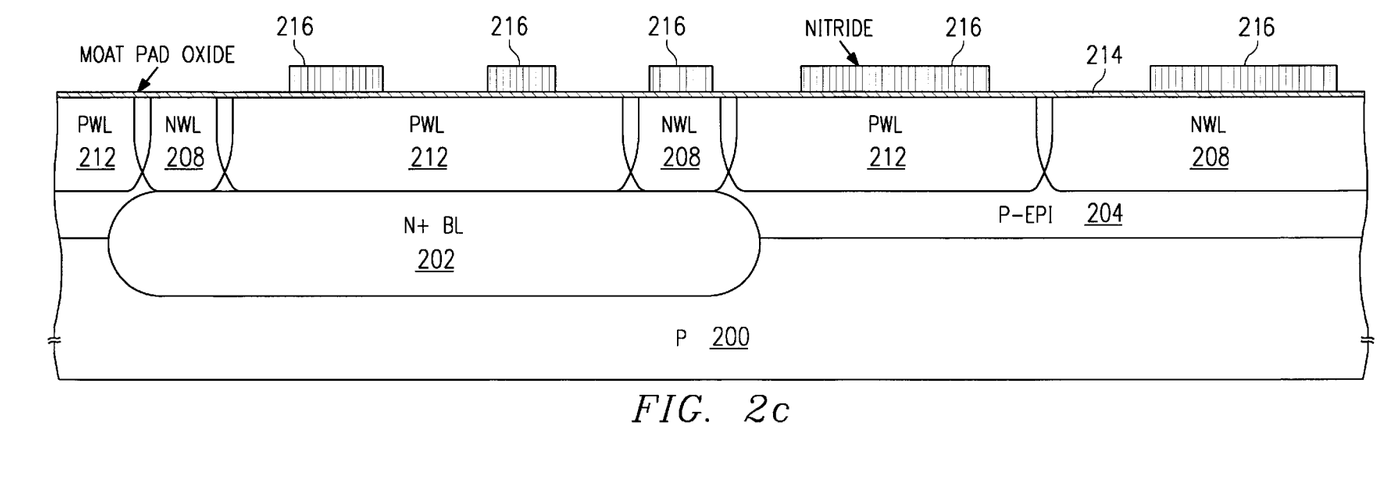
Figure 2D:
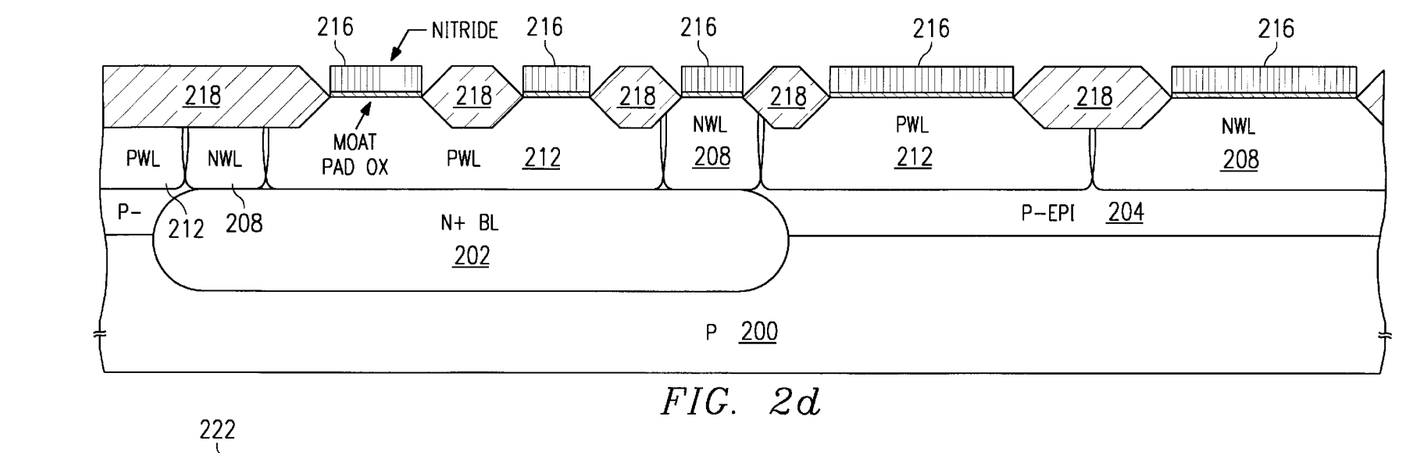
Figure 2E:
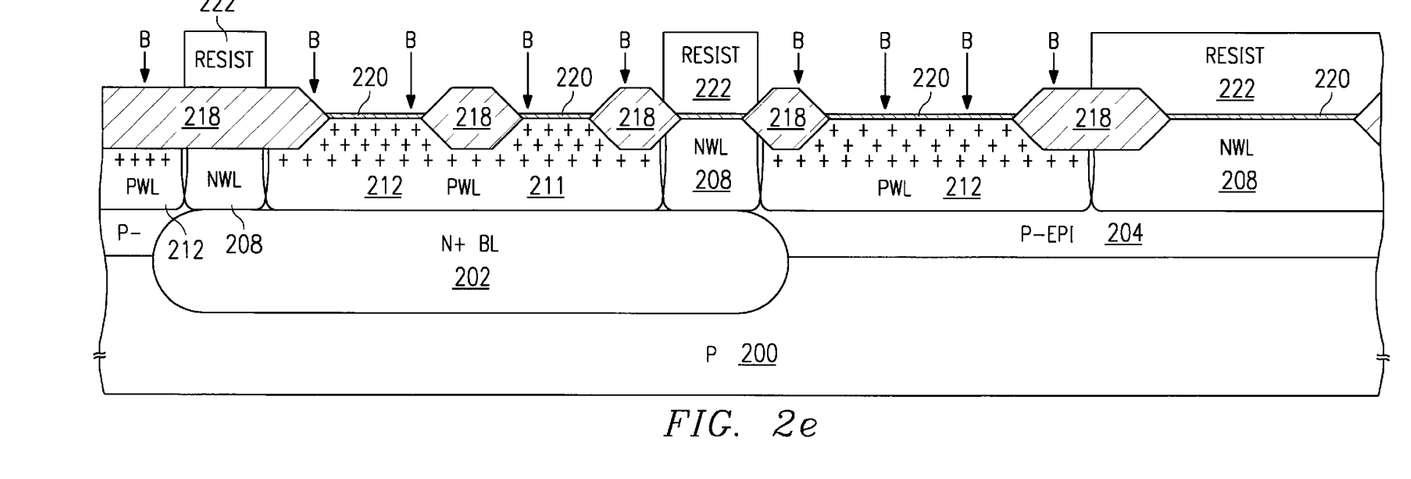
Figure 4A:
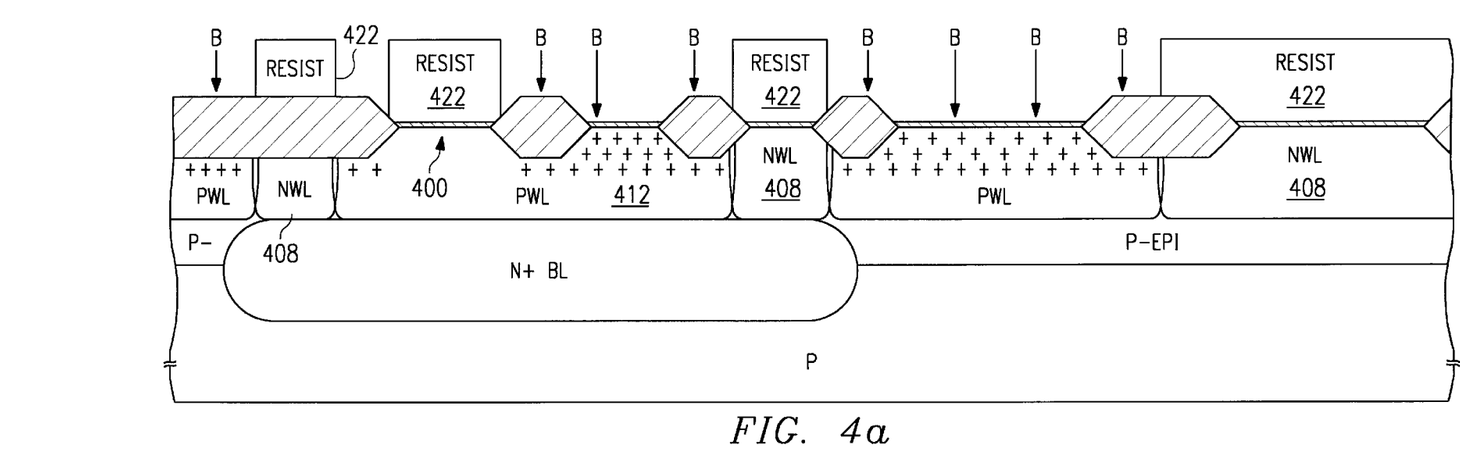
FIGS. 4a and 4b are cross-sectional diagrams of a second embodiment BiCMOS structure at two steps in a second embodiment process.
Figure 4B:
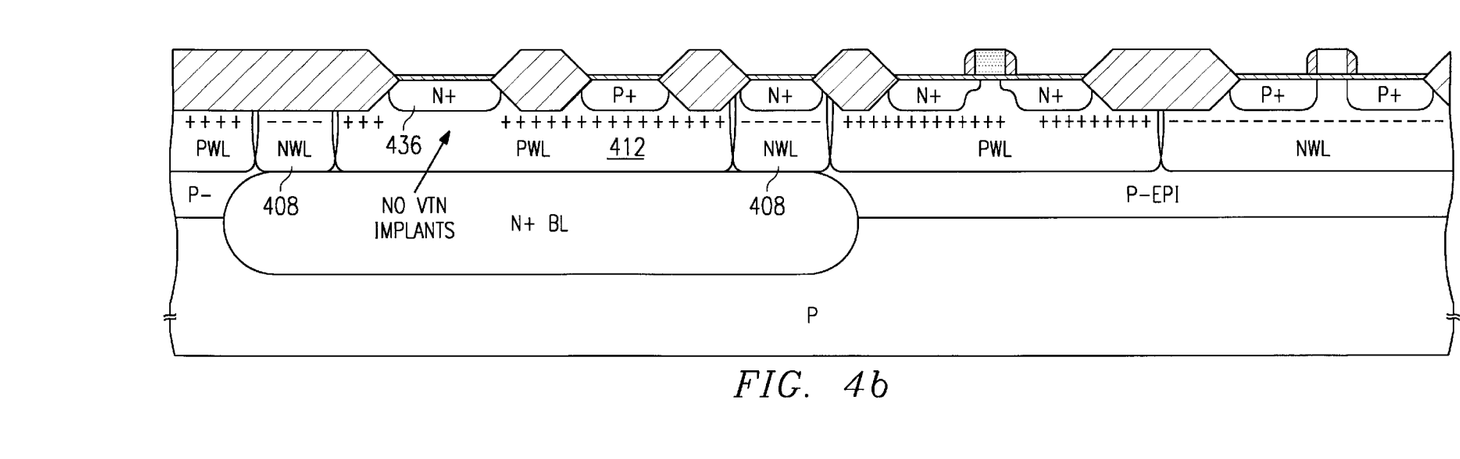
Figure 5A:
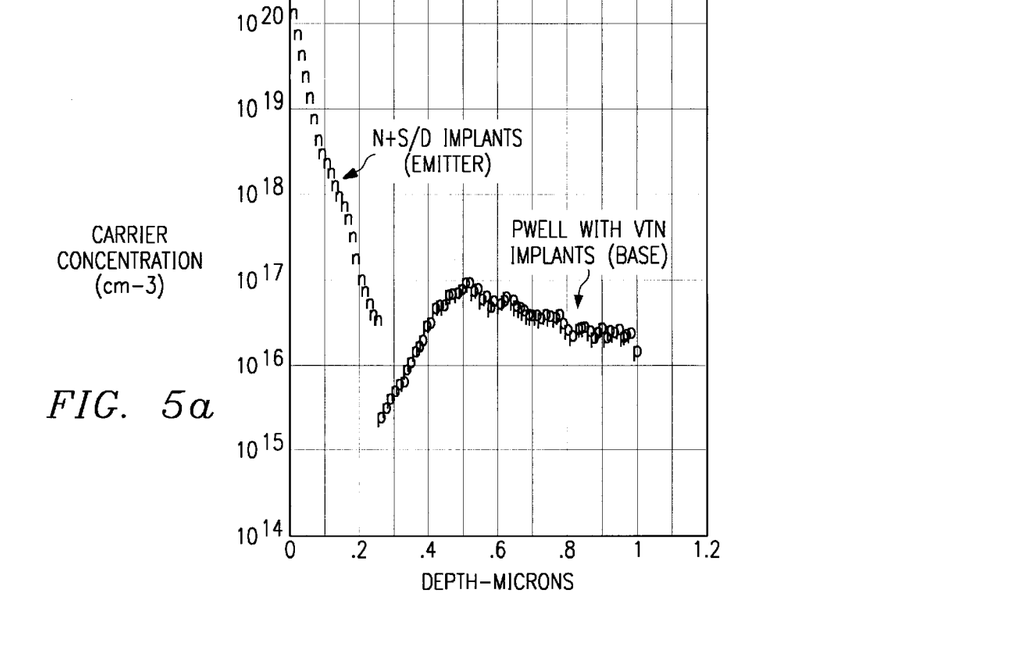
FIG. 5a is a spreading resistance plot of the emitter-base dopant profile of a bipolar transistor in the first embodiment BiCMOS structure.
Figure 5B:
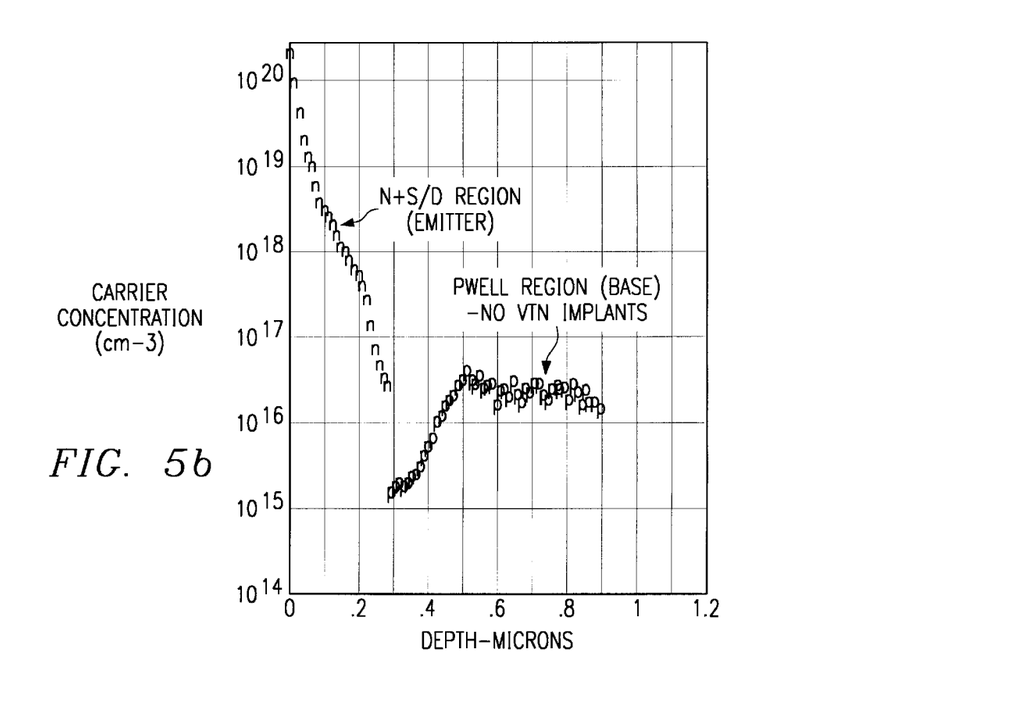
FIG. 5b is a spreading resistance plot of the emitter-base dopant profile of a bipolar transistor in the second embodiment BiCMOS structure.

In a second preferred embodiment in accordance with the invention, shown in FIGS. 4a and 4b, the masking of the VTN implants described in step (g) above and in FIG. 2e is modified. Specifically, the photoresist mask 422 is modified to cover the emitter region 400 in addition to the n-wells 408 covered in the first embodiment process described above. As shown in FIG. 4b, the portion of the p-well 412 beneath the emitter contact 436 is devoid of dopants from the VTN implants, in contrast to the substantially uniform lateral base doping of the first embodiment. Consequently, the base doping is set solely by the p-well 412 doping level, resulting in a bipolar transistor with higher gain ($h_{fe}$) than in the first embodiment process. The second preferred embodiment process is achieved with only a modification of an implant mask. An integrated circuit die that includes both types of bipolar transistor is therefore easily fabricated. Such an integrated circuit could therefore include a high $H_{fe}$ bandgap reference device (formed with the no-VTN implant npn transistor) as well as a higher Early voltage transistor (formed with the VTN implant npn transistor) as may be used in the output stage of an amplifier, for example. FIG. 5a is a spreading resistance plot of a transistor fabricated in accordance with the first preferred embodiment process, which includes the base VTN implants, and FIG. 5b is a result of a transistor fabricated in accordance with the second preferred embodiment process, which omits the VTN implants. A comparison of the two plots makes clear the effect of the threshold adjustment, punch-through, and channel stop implants.

Figure 2F:
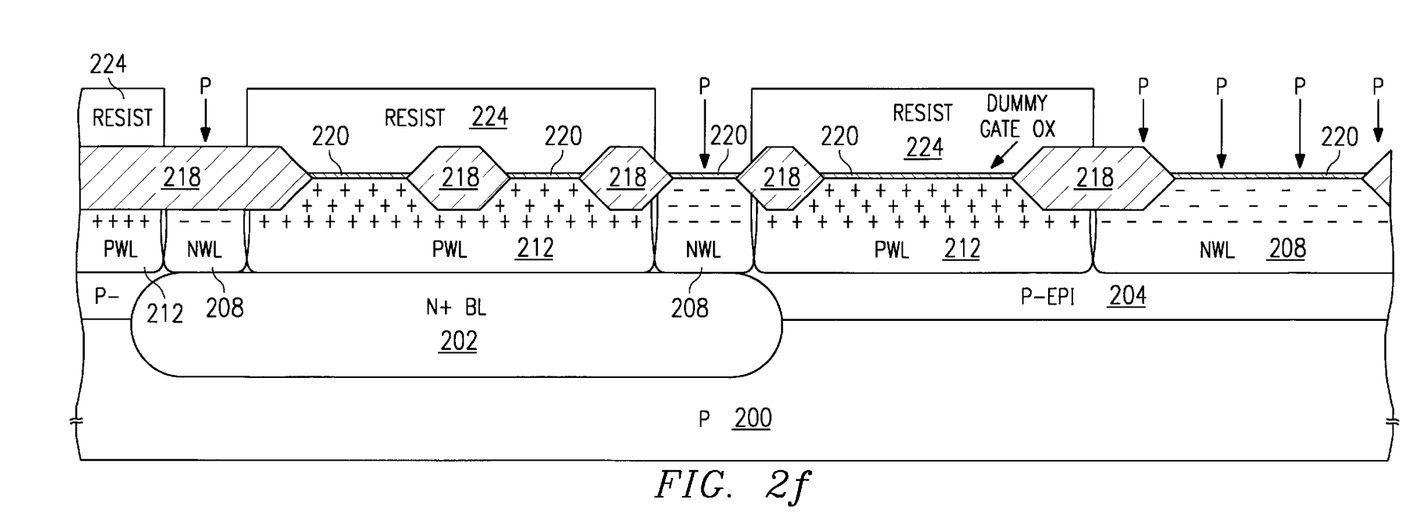
Figure 2G:
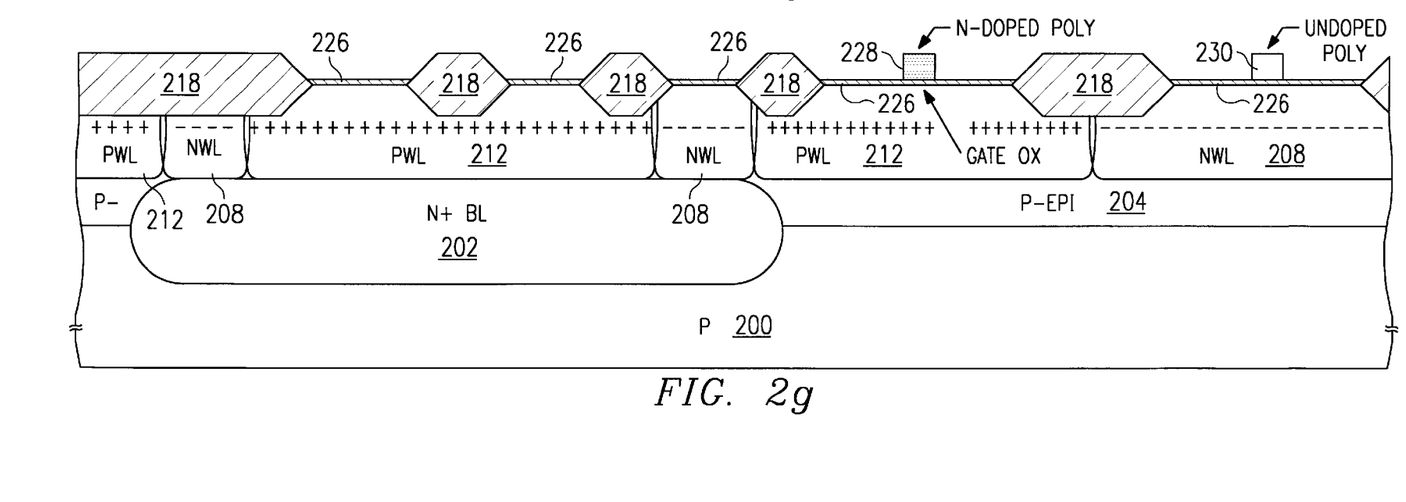
Figure 2H:
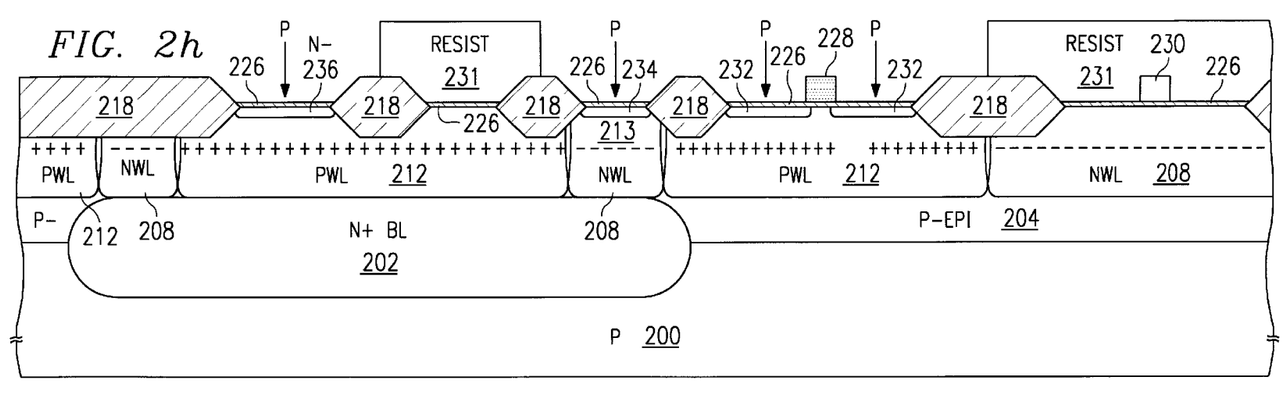
Figure 2I:
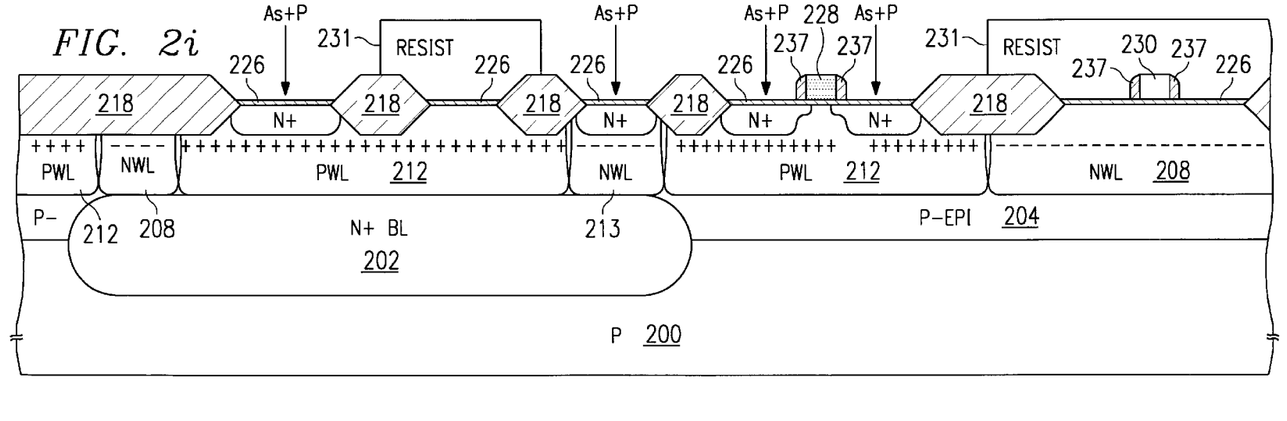
Figure 2J:
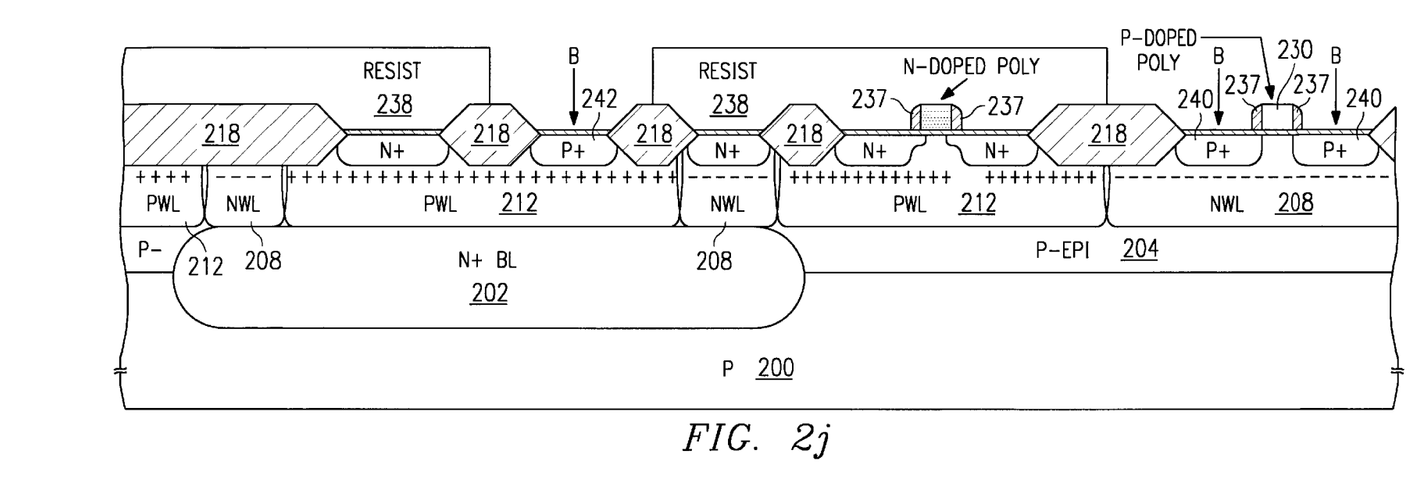
Figure 2K:
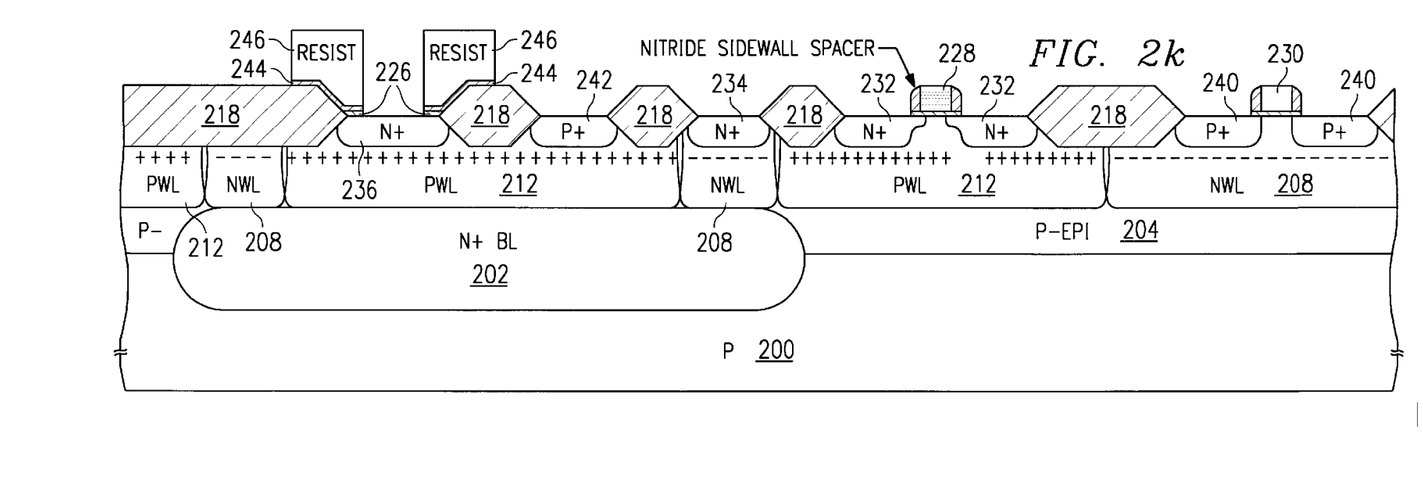
Figure 2L:
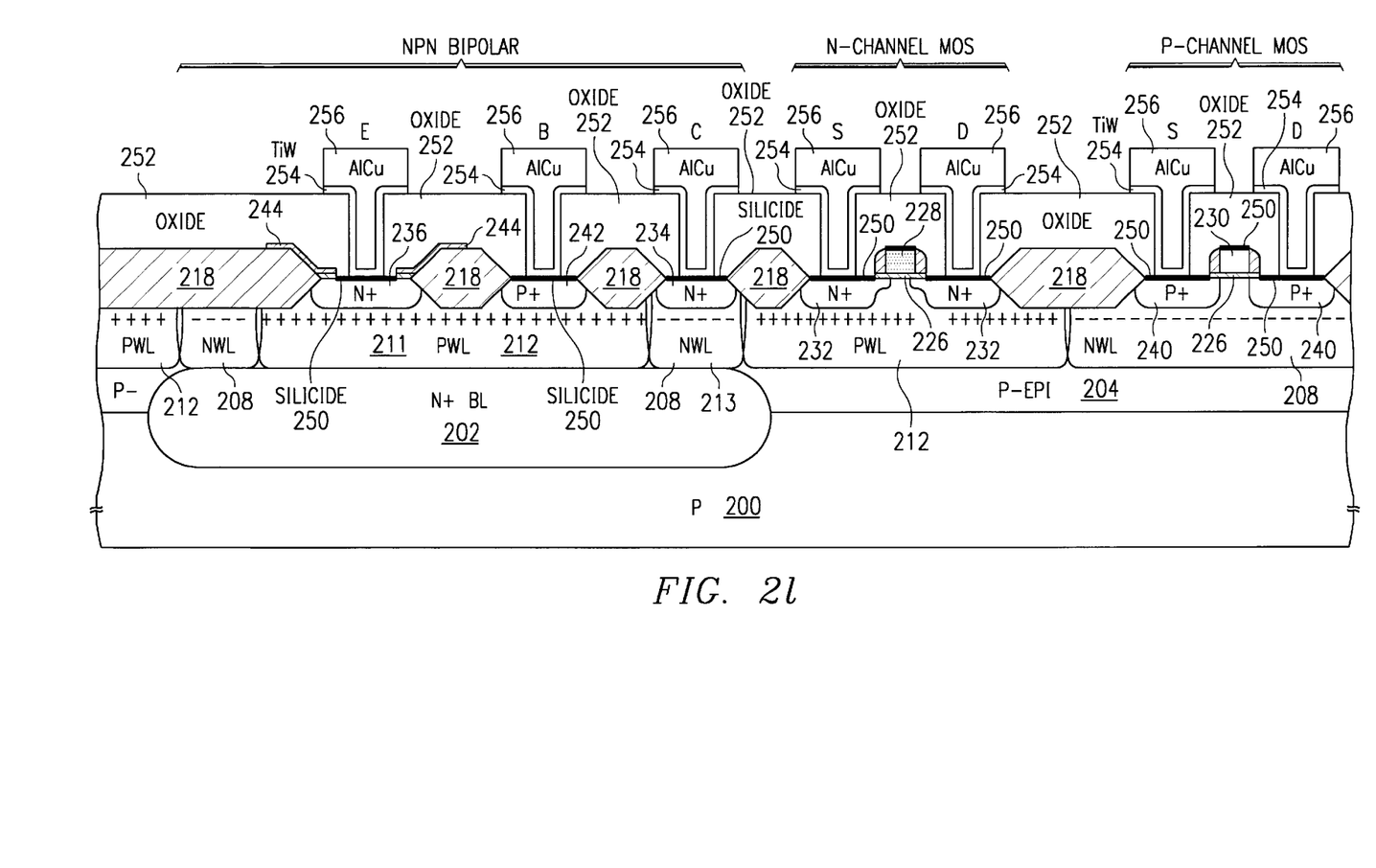
Figure 6A:
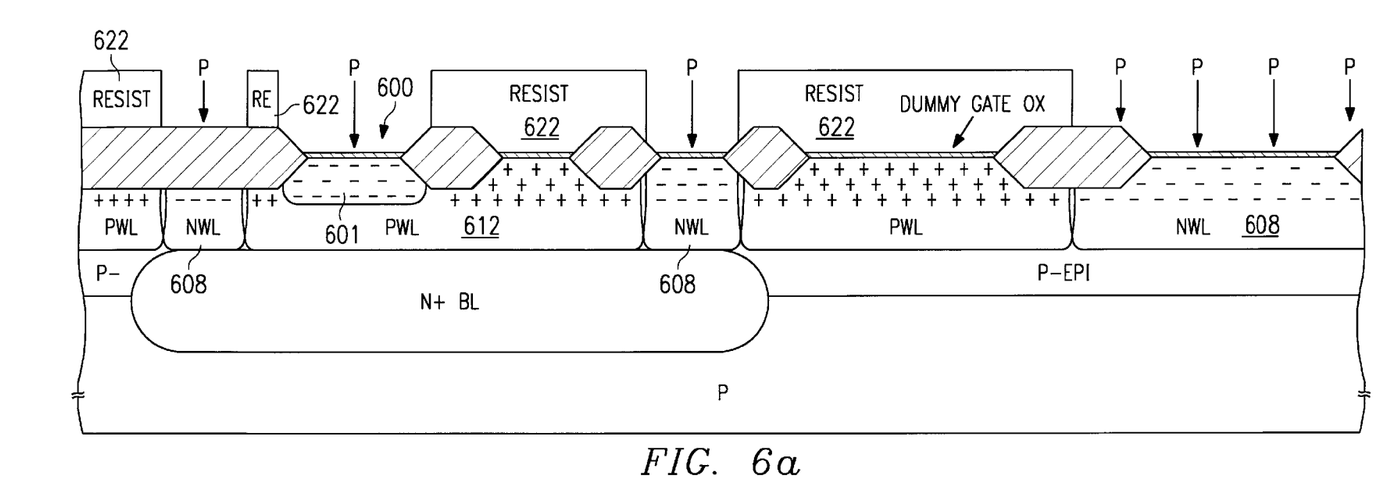
FIGS. 6a and 6b are cross-sectional diagrams of a third embodiment BiCMOS structure at two steps in a third embodiment process.
Figure 6B:
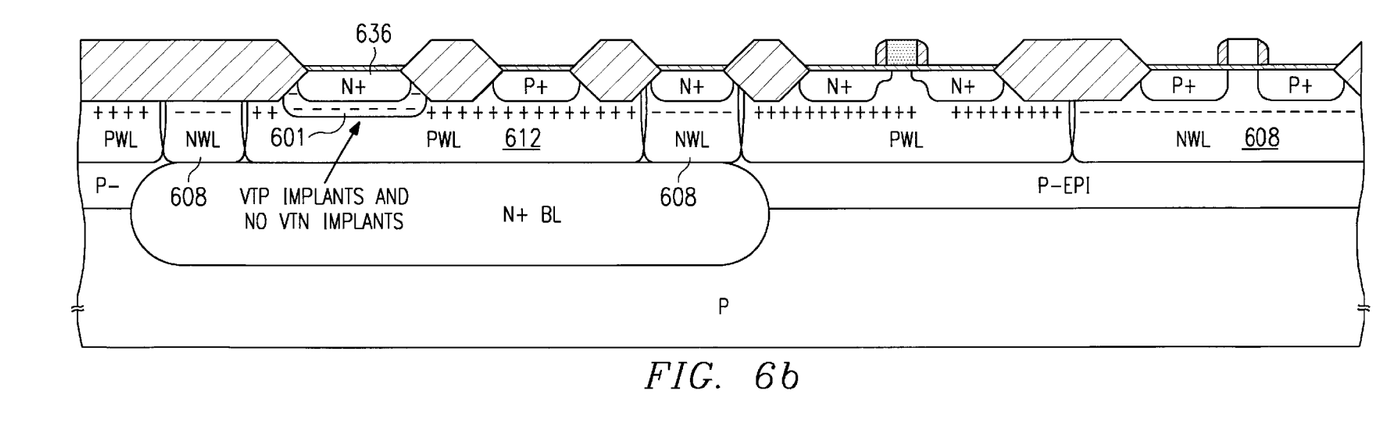

In a third preferred embodiment in accordance with the invention, the first and second preferred embodiment processes are modified as shown in FIGS. 6a and 6b. Specifically, the mask used for the VTP implants described in step (h) above and in FIG. 2f is modified to expose the emitter region 600 in addition to the n-wells 608. This modification involves the mask for the VTP implants, and hence may be used in conjunction with the second preferred embodiment process in which the modification involves the masking for the VTN implants. Note that the third preferred embodiment could also be applied to the first preferred embodiment process. FIGS. 6a and 6b show the effects of the third preferred embodiment process on a structure that has been subjected to the second preferred embodiment process. In other words, the emitter region 600 is devoid of dopants from the VTN implants. Instead, the VTP implant results in an n-type region that extends deeper into the p-well 612 than the emitter 636 (shown in FIG. 6b). As a result of these modifications, the bipolar transistor produced by the third preferred embodiment process has a higher gain than that produced by the second preferred embodiment process.

Figure 7A:
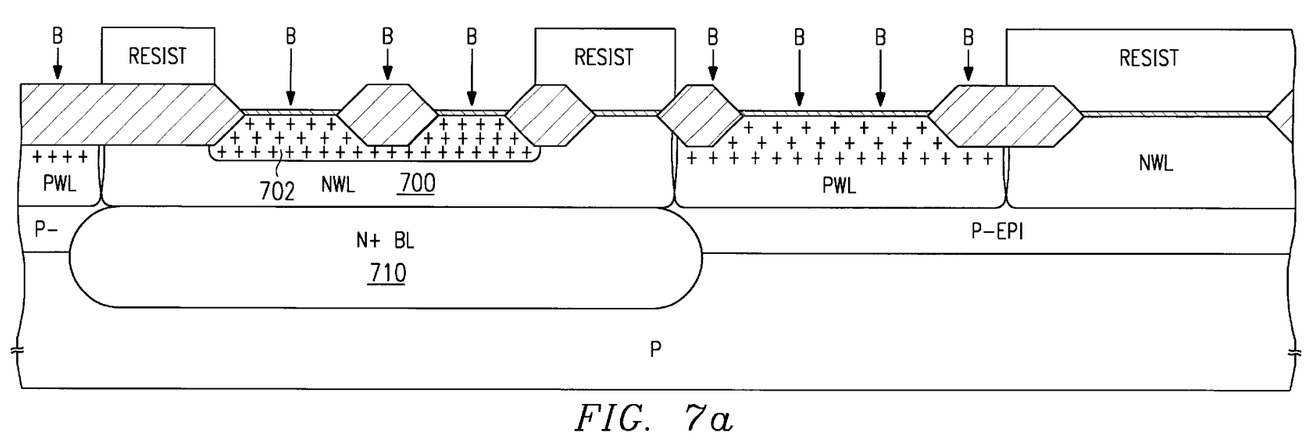
FIGS. 7a and 7b are cross-sectional diagrams of a fourth embodiment BiCMOS structure at two steps in a fourth embodiment process.
Figure 7B:
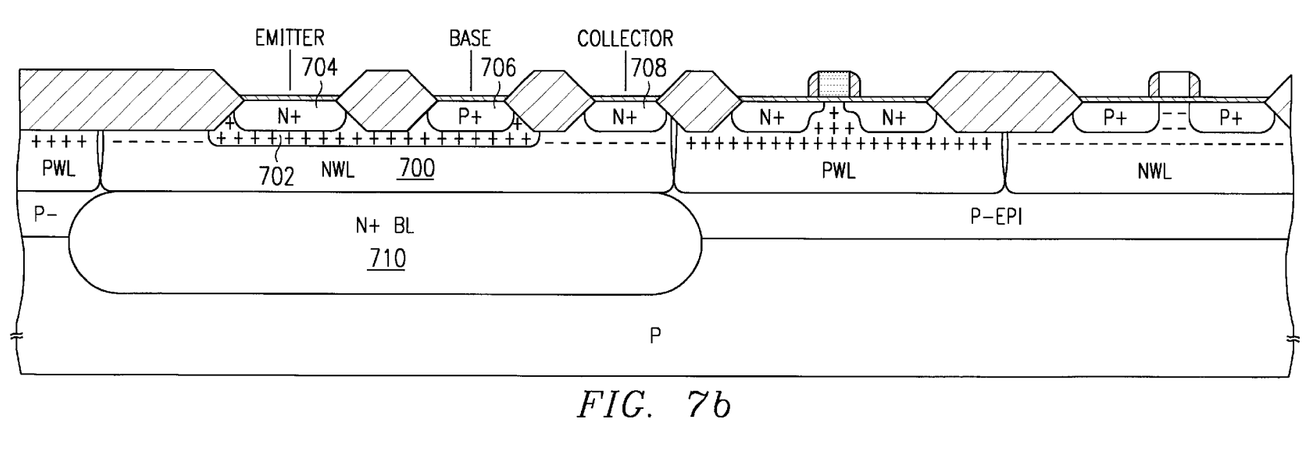

A fourth preferred embodiment in accordance with the invention is shown in FIGS. 7a and 7b. In this embodiment the bipolar transistor is formed in an n-well 700, rather than the p-well used in the first three embodiments described above. The base region 702 is formed with the VTN implants. The VTN implants counterdope the surface of n-well 700 to form the shallow (in the range of approximately 0.1 to 0.2um) base region. The shallow base width makes possible an npn transistor capable of higher operating speeds than the thicker-base embodiments described above where the base depth is set by the epi layer thickness. In addition, the use of a single set of implants for both the VTN implants and the base of the npn transistor saves a mask and the associated costs incurred in prior art approaches in which two different implant steps are used for the npn base and the threshold adjustment, channel-stop, and punch-through prevention implants of the n-channel MOS transistor.

In FIG. 7b, the emitter region 704 and base contact 706 are formed in the base region 702 as in the embodiments described above. The collector contact 708 is formed in n-well 700, which acts as the collector for the transistor. This process relies on modified masks for the n-well and VTN implants, but otherwise adds no complexity to the embodiment processes described above. The fourth preferred embodiment structure can also be arranged to occupy less die space than the first preferred embodiment structure, for example. The annular n-well 302 (element 208 in FIGS. 2a to 2l) used for isolating the base region 211 from the remainder of epi layer 211 in FIG. 2l can be avoided with the implanted base approach of the fourth preferred embodiment structure, thus saving die space.

Figure 8:
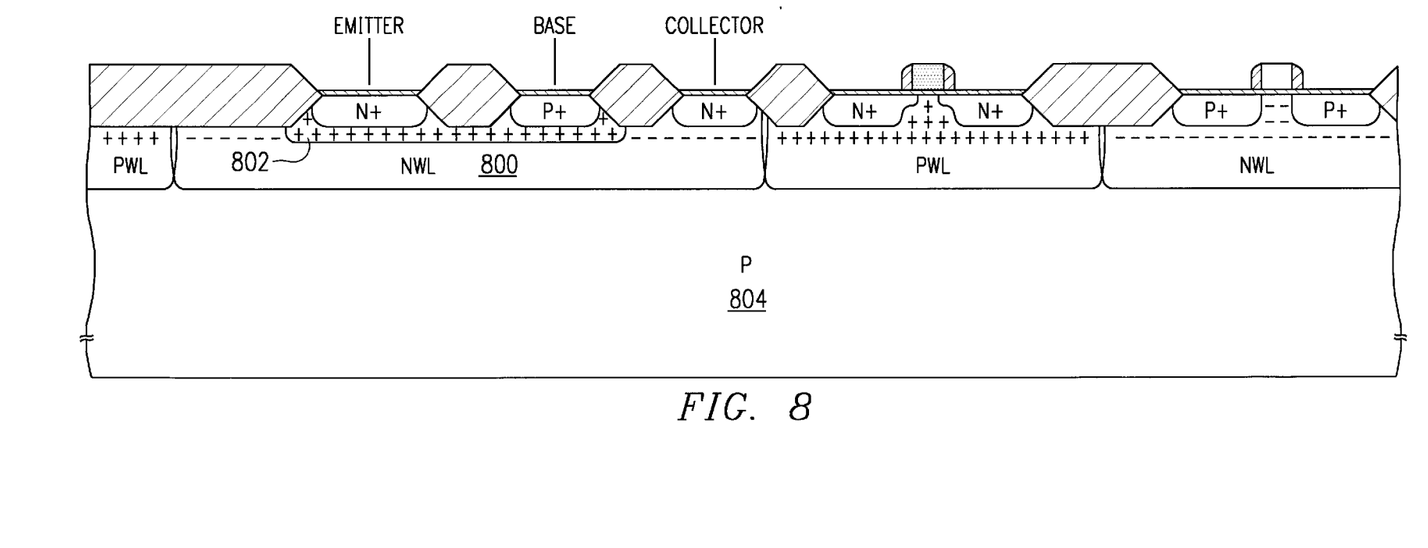
FIG. 8 is a cross-sectional diagram of a fifth embodiment BiCMOS structure at a step in a fifth embodiment process. The cross-sectional diagrams described above show the bipolar, n-channel MOS, and p-channel MOS transistors adjacent one another to facilitate the description of process flows. Note that in practice the bipolar and MOS transistors may be in close proximity as shown, or alternatively, may be distributed over a semiconductor die.

A fifth preferred embodiment in accordance with the invention is shown in FIG. 8. The structure of FIG. 8 is similar to that of FIG. 7b, except the buried layer 710 is omitted in FIG. 8. The structure of FIG. 8 provides an isolated vertical npn transistor that is manufacturable in standard CMOS processes, which typically lack the process steps involved in forming buried layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating a BiCMOS integrated circuit, comprising the steps of:
   forming in a single implantation step a base region of a bipolar transistor and a p-well of an n-channel MOS transistor; and
   forming in a single implantation step a collector contact well of a bipolar transistor and an n-well of a p-channel MOS transistor, said collector contact well adjoining a collector region and extending to a surface of a semiconductor substrate.

2. A method for fabricating a BiCMOS integrated circuit, comprising the steps of:
   forming an n-type collector region within a semiconductor substrate of lighter doping;
   forming a plurality of p-type wells, at least one of said plurality of p-type wells forming a base region lying between said collector region and a surface of said semiconductor substrate, said base region adjoining said collector region and extending to said surface, and at least one of said plurality of p-type wells forming an n-channel MOS well;
   forming a plurality of n-type wells, at least one of said plurality of n-type wells forming a collector contact well lying between said collector region and said surface of said semiconductor substrate, said collector contact well adjoining said collector region and extending to said surface, further said collector contact well lying between said base region and said n-channel MOS well, and at least one of said plurality of n-type wells forming a p-channel MOS well; and
   forming an emitter region adjoining said base region, said emitter region extending to said surface.

3. The method of claim 2, further including the step of implanting p-dopants into said p-type wells, excluding a portion of said base region adjacent said emitter region.

4. The method of claim 3, further including the step of implanting n-type dopants into said n-type wells and into a portion of said base region.

5. The method of claim 2, further including the step of implanting n-type dopants into said n-type wells and into a portion of said base region.

\* \* \* \* \*

(12) EX PARTE REEXAMINATION CERTIFICATE (8017th)
United States Patent
Hutter et al.

(10) Number: US 6,352,887 C1
(45) Certificate Issued: Feb. 8, 2011

(54) MERGED BIPOLAR AND CMOS CIRCUIT AND METHOD (75) Inventors: Louis N. Hutter, Richardson, TX (US); Peter Ying, Plano, TX (US); Marco Corsi, Plano, TX (US); Imran Khan, Richardson, TX (US)

(73) Assignee: Texas Instruments Incorporated, Dallas, TX (US)

Reexamination Request:
No. 90/011,002, May 18, 2010

Reexamination Certificate for:
Patent No.: 6,352,887
Issued: Mar. 5, 2002
Appl. No.: 09/276,780
Filed: Mar. 25, 1999

Related U.S. Application Data

(60) Provisional application No. 60/079,444, filed on Mar. 26, 1998.

(51) Int. Cl.
*H01L 21/70* (2006.01)
*H01L 21/8249* (2006.01)
*H01L 27/06* (2006.01)

(52) U.S. Cl. .................. 438/202; 438/203; 438/236; 438/327; 438/374; 257/E27.015; 257/E21.696

(58) Field of Classification Search .................. None
See application file for complete search history.

(56) References Cited

FOREIGN PATENT DOCUMENTS

JP 04214664 8/1992

*Primary Examiner*—Erik Kielin (57) ABSTRACT

A method for fabricating a BiCMOS integrated circuit. The method includes the steps of forming in a single implantation step a base region 211 of a bipolar transistor and a p-well 212 of an n-channel MOS transistor; and forming in a single implantation step a collector contact well 213 of a bipolar transistor and an n-well 208 of a p-channel MOS transistor.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 2 is confirmed.

Claim 1 is determined to be patentable as amended.

Claims 3-5 were not reexamined.

1. A method for fabricating a BiCMOS integrated circuit, comprising the steps of:

forming in a single implantation step a base region of a bipolar transistor and a p-well of an n-channel MOS transistor; and forming in a single implantation step a collector contact well of a bipolar transistor and an n-well of a p-channel MOS transistor, said collector contact well *formed over and* adjoining a collector region and extending to a surface of a semiconductor substrate.

* * * * *